(12) United States Patent
Liu et al.

(10) Patent No.: US 12,652,877 B2
(45) Date of Patent: Jun. 9, 2026

(54) IMAGE SENSOR HAVING INTERNAL REFLECTOR IN COLOR FILTER

(71) Applicant: VisEra Technologies Company Ltd., Hsin-Chu City (TW)

(72) Inventors: Hao-Wei Liu, Hsin-Chu City (TW); Sheng-Chuan Cheng, Hsin-Chu City (TW); Ching-Chiang Wu, Hsin-Chu City (TW)

(73) Assignee: VisEra Technologies Company Ltd., Hsin-Chu City (TW)

( * ) Notice: Subject to any disclaimer, the term of this patent is extended or adjusted under 35 U.S.C. 154(b) by 650 days.

(21) Appl. No.: 18/169,126

(22) Filed: Feb. 14, 2023

(65) Prior Publication Data

US 2024/0274634 A1 Aug. 15, 2024

(51) Int. Cl.
| | |
|---|---|
| *H10F 39/00* | (2025.01) |
| *H04N 25/11* | (2023.01) |
| *G02B 5/20* | (2006.01) |

(52) U.S. Cl.
CPC ......... *H10F 39/8067* (2025.01); *H04N 25/11* (2023.01); *H10F 39/8053* (2025.01); *G02B 5/201* (2013.01)

(58) Field of Classification Search
None
See application file for complete search history.

(56) References Cited

U.S. PATENT DOCUMENTS

| | | | | |
|---|---|---|---|---|
| 8,530,266 | B1 * | 9/2013 | Chen | H10F 39/8057 |
| | | | | 257/730 |
| 10,121,809 | B2 * | 11/2018 | Pang | H04N 25/134 |
| 2012/0182453 | A1 * | 7/2012 | Hiramoto | H04N 23/84 |
| | | | | 348/E9.003 |
| 2015/0048467 | A1 * | 2/2015 | Weng | H10F 39/026 |
| | | | | 438/70 |
| 2016/0047690 | A1 * | 2/2016 | Yun | H10F 39/024 |
| | | | | 250/206 |
| 2018/0204961 | A1 * | 7/2018 | Lee | H10F 39/8067 |
| 2022/0130879 | A1 * | 4/2022 | Yamazaki | H04N 25/702 |

FOREIGN PATENT DOCUMENTS

| | | |
|---|---|---|
| JP | 2015065270 A | 4/2015 |
| JP | 2017028241 A | 2/2017 |
| WO | 2017073321 A | 5/2017 |
| WO | 2019065143 A | 4/2019 |

* cited by examiner

*Primary Examiner* — Nilufa Rahim
(74) *Attorney, Agent, or Firm* — LIU & LIU

(57) ABSTRACT

An image sensor includes a first unit. The first unit includes a first photodiode having a first dimension, a second photodiode disposed adjacent the first photodiode and having a second dimension that is greater than the first dimension, a first color filter overlapping the first photodiode and the second photodiode, and a first internal reflector disposed in the first color filter and overlapping the first photodiode. The first internal reflector has an inclined light receiving surface inclined from a top surface of the first color filter toward the second photodiode, and a refraction index of the first internal reflector is smaller than a refraction index of the first color filter.

18 Claims, 11 Drawing Sheets

IMAGE SENSOR HAVING INTERNAL REFLECTOR IN COLOR FILTER

BACKGROUND

Field of Invention

The present disclosure relates to an image sensor.

Description of Related Art

High-speed image sensors have been widely used in many applications in various fields, including automotive, machine vision, and professional video recording. Techniques for fabricating image sensors, and in particular complementary metal oxide semiconductor (CMOS) image sensors, have continued to advance at a rapid rate. For example, the need for higher frame rates and lower power consumption has facilitated further miniaturization and integration of such image sensors.

In some technique field such as in an automotive industry, there is an ongoing effort to improve the overall safety of vehicles during operation by positioning a digital video camera on the vehicle and providing a small display in the cabin for the driver. The accurate perception of moving objects and detection with high color reproducibility for all light conditions are desired. Such application requires a high dynamic range (HDR) to capture the range of scene illumination from $10^{-1}$ lux (for night vision) to $10^5$ lux (for bright sunlight or direct headlight lighting conditions). This high dynamic range corresponds to at least one dynamic range of 100 dB or more. Current CMOS sensors are difficult to achieve this range due to full well limits and noise floor limitations. A high dynamic range sensor design is needed to extend the application of CMOS image sensors to high dynamic range fields.

SUMMARY

An aspect of the disclosure provides an image sensor including a first unit. The first unit includes a first photodiode having a first dimension, a second photodiode disposed adjacent the first photodiode and having a second dimension that is greater than the first dimension, a first color filter overlapping the first photodiode and the second photodiode, and a first internal reflector disposed in the first color filter and overlapping the first photodiode. The first internal reflector has an inclined light receiving surface inclined from a top surface of the first color filter toward the second photodiode, and a refraction index of the first internal reflector is smaller than a refraction index of the first color filter.

According to some embodiments of the disclosure, the refraction index of the first internal reflector is greater than 1.

According to some embodiments of the disclosure, a difference between the refraction index of the first internal reflector and the refraction index of the first color filter is greater than 0.2.

According to some embodiments of the disclosure, the first unit further includes a grid surrounding the first color filter, wherein a ratio of a height of the first internal reflector to a height of the grid is from 0.3 to 1.

According to some embodiments of the disclosure, the first internal reflector has a fifth dimension, and the fifth dimension is greater than the first dimension of the first photodiode and is smaller than a sum of the first dimension of the first photodiode and half of the second dimension of the second photodiode.

According to some embodiments of the disclosure, the first unit further includes a grid surrounding the first color filter. The first internal reflector has an angle $\theta_1$ between the inclined light receiving surface and the first photodiode, and the angle $\theta_1$ satisfies:

$$\frac{0.3 * H_1}{0.5 * W_2 + W_1} \leq \tan\theta_1 \leq \frac{H_1}{W_1},$$

in which $H_1$ is a height of the grid, $W_1$ is the first dimension of the first photodiode, and $W_2$ is the second dimension of the second photodiode.

According to some embodiments of the disclosure, the first color filter extends continuously from the first photodiode to the second photodiode.

According to some embodiments of the disclosure, the first photodiode and the second photodiode share a symmetric axis.

According to some embodiments of the disclosure, the first internal reflector comprises a transparent organic material.

According to some embodiments of the disclosure, the first internal reflector is a triangle prism.

According to some embodiments of the disclosure, the image sensor further comprising a second unit, the second unit includes a third photodiode having a third dimension, a fourth photodiode disposed adjacent the third photodiode and having a fourth dimension that is greater than the third dimension, a second color filter overlapping the third photodiode and the fourth photodiode, and a second internal reflector disposed in the second color filter and overlapping the third photodiode. The second internal reflector has an inclined light receiving surface inclined from a top surface of the second color filter toward the fourth photodiode, a refraction index of the second internal reflector is smaller than a refraction index of the second color filter, and a transparency of the second internal reflector is different from a transparency of the first internal reflector.

According to some embodiments of the disclosure, the refraction index of the second internal reflector is greater than 1.

According to some embodiments of the disclosure, a difference between the refraction index of the second internal reflector and the refraction index of the second color filter is greater than 0.2.

According to some embodiments of the disclosure, the second unit further includes a grid surrounding the second color filter, wherein a ratio of a height of the second internal reflector to a height of the grid is from 0.3 to 1.

According to some embodiments of the disclosure, the second internal reflector has a sixth dimension, and the sixth dimension is greater than the third dimension of the third photodiode and is smaller than a sum of the third dimension of the third photodiode and half of the fourth dimension of the fourth photodiode.

According to some embodiments of the disclosure, the second unit further includes a grid surrounding the second color filter, wherein the second internal reflector has an angle $\theta_2$ between the inclined light receiving surface and the third photodiode, and the angle $\theta_2$ satisfies:

$$\frac{0.3 * H_1}{0.5 * W_4 + W_3} \leq \tan\theta_2 \leq \frac{H_1}{W_3},$$

in which $H_1$ is a height of the grid, $W_3$ is the third dimension of the third photodiode, and $W_4$ is the fourth dimension of the fourth photodiode.

According to some embodiments of the disclosure, the second color filter extends continuously from the third photodiode to the fourth photodiode.

According to some embodiments of the disclosure, an extinction coefficient of the second internal reflector is from 0.1 to 0.3.

According to some embodiments of the disclosure, the second internal reflector is a triangle prism.

According to some embodiments of the disclosure, the first unit further includes a first lens on the first photodiode, and a second lens on the second photodiode.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
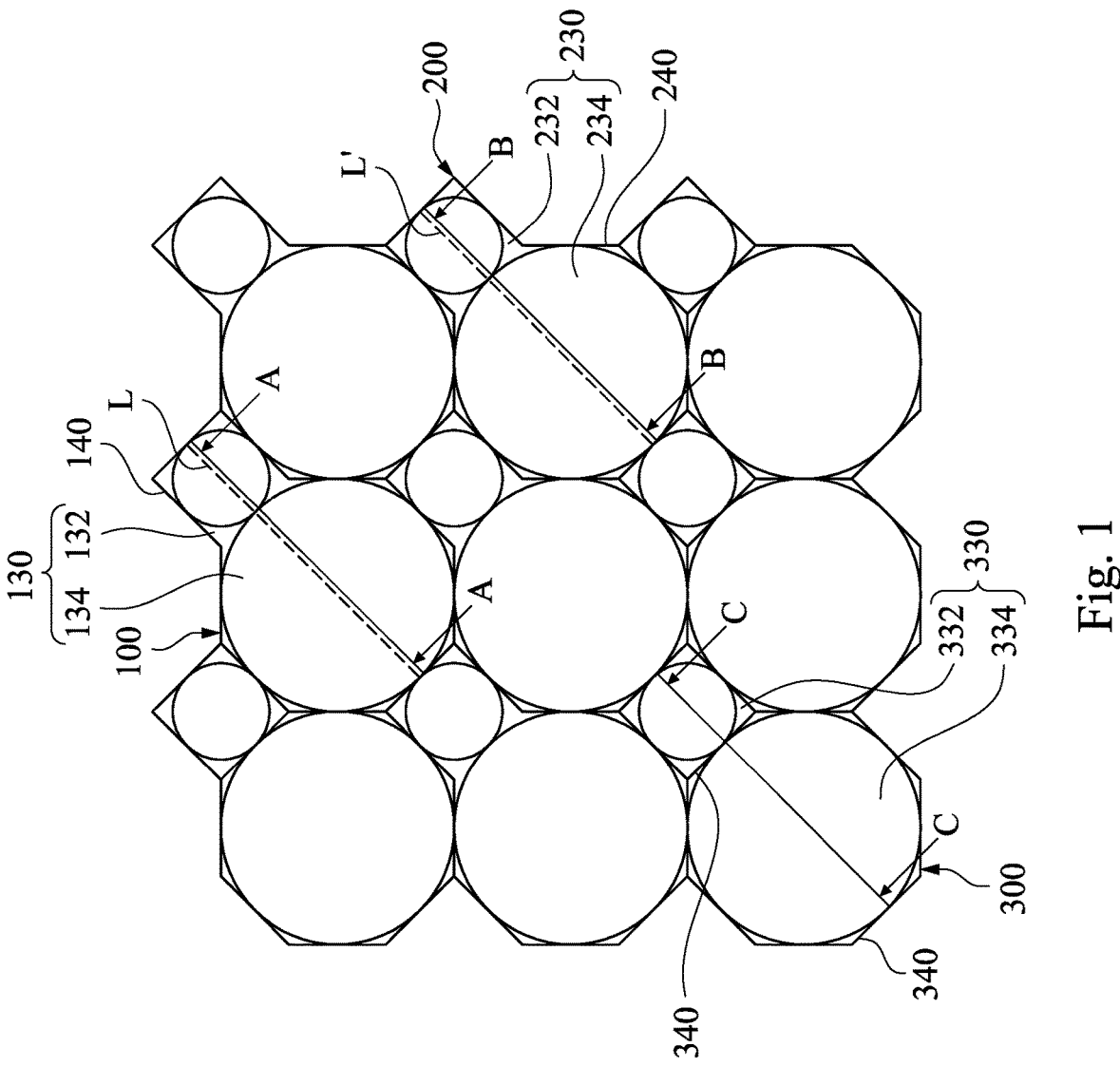
FIG. 1 is a top view of an image sensor according to some embodiments of the disclosure.

Reference will now be made in detail to the present embodiments of the invention, examples of which are illustrated in the accompanying drawings. Wherever possible, the same reference numbers are used in the drawings and the description to refer to the same or like parts.

Reference is made to FIG. 1, which is a top view of an image sensor according to some embodiments of the disclosure. The image sensor 10 includes a plurality of first units 100, a plurality of second units 200, and a plurality of third units 300. The first units 100, the second units 200, and the third units 300 have different optical characteristics and structural designs. In some embodiments, the ratio and the arrangement of the first units 100, the second units 200, and the third units 300 of the image sensor 10 can be designed according to different requirements.

Figure 2:
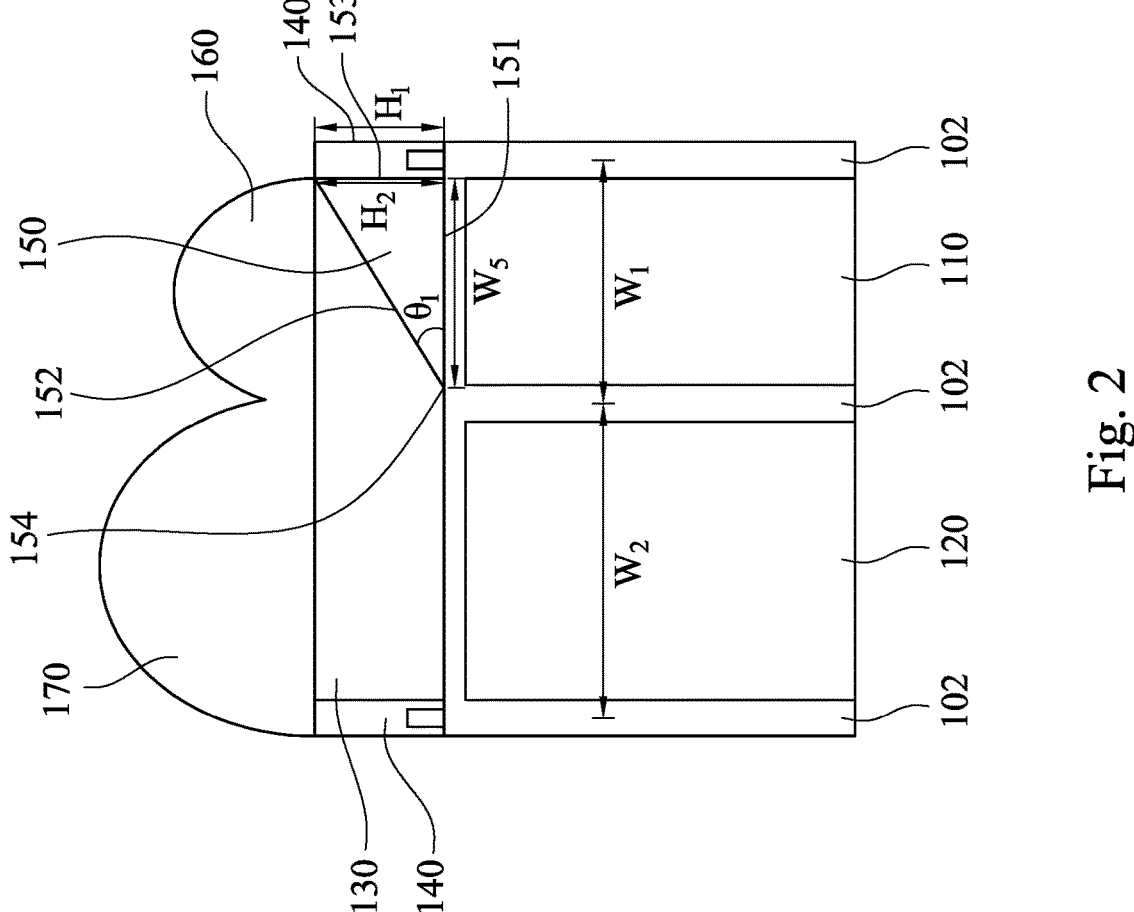
FIG. 2 is a cross-sectional view taken along line A-A of FIG. 1, illustrating the cross-section of the first unit according to some embodiments of the disclosure.
Figure 2:
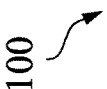

Reference is made to FIG. 1 and FIG. 2, in which FIG. 2 is a cross-sectional view taken along line A-A of FIG. 1, illustrating the cross-section of the first unit according to some embodiments of the disclosure. The first unit 100 includes a first photodiode 110 having a first dimension $W_1$ and a second photodiode 120 having a second dimension $W_2$. The second photodiode 120 is disposed adjacent the first photodiode 110, and the second dimension $W_2$ of the second photodiode 120 is greater than the first dimension $W_1$ of the first photodiode 110. In some embodiments, the first photodiode 110 and the second photodiode 120 share a symmetric axis L.

More particularly, the first unit 100 includes a deep trench isolation structure 102 configured to separate the first photodiode 110 from the second photodiode 120. The first dimension $W_1$ of the first photodiode 110 is measured between the distance between centers of the pair of deep trench isolation structure 102 at opposite sides of the first photodiode 110 in the direction of the symmetric axis L, and the second dimension $W_2$ of the second photodiode 120 is measured between the distance between centers of the pair of deep trench isolation structure 102 at opposite sides of the second photodiode 120 in the direction of the symmetric axis L.

The first unit 100 further includes a first color filter 130 overlapping the first photodiode 110 and the second photodiode 120. The first color filter 130 can be a R/G/B filter or a C/Y/M color filter. The first color filter 130 extends continuously from the first photodiode 110 to the second photodiode 120.

The first unit 100 further includes a first grid 140 surrounding the first color filter 130. Because the first color filter 130 overlaps the first photodiode 110 and the second photodiode 120, and the second dimension $W_2$ of the second photodiode 120 is greater than the first dimension $W_1$ of the first photodiode 110, the first grid 140 is not in a shape of rectangular and does not has a portion between the first photodiode 110 and the second photodiode 120.

More particularly, the first color filter 130 has a first portion 132 directly over the first photodiode 110 and a second portion 134 directly over the second photodiode 120, in which the first portion 132 and the second portion 134 allow the same wavelength band passing through. The first portion 132 of the first color filter 130 is directly connected to the second portion 134 of the first color filter 130, without any portion of the first grid 140 interposing therebetween.

The first unit 100 further includes a first internal reflector 150 disposed in the first color filter 130 and overlapping the first photodiode 110. In some embodiments, the first internal reflector 150 is a triangle prism. In some embodiments, the first internal reflector 150 is made of a transparent organic material. The first internal reflector 150 has an inclined light receiving surface 152 and a vertex 154 pointing to the second photodiode 120. More particularly, the first internal reflector 150 has a triangle cross-section, and the bottom surface 151 of the first internal reflector 150 is parallel and adjacent to the light receiving plane of the first photodiode 110, the side surface 153 of the first internal reflector 150 is perpendicular to the light receiving plane of the first photodiode 110, and inclined light receiving surface 152 interconnects the bottom surface 151 and the side surface 153 of the first internal reflector 150 and is inclined from a top surface of the first color filter 130 toward the second photodiode 120. In some embodiments, the first internal reflector 150 is completely embedded in the first color filter 130.

A refraction index of the first internal reflector 150 is smaller than a refraction index of the first color filter 130 such that the light path of the indicating light is modified by the interface between the first internal reflector 150 and the first color filter 130, to allow more light amount into the second photodiode 120 having the larger dimension $W_2$. In some embodiments, the refraction index of the first internal reflector 150 is greater than 1. In some embodiments, a difference between the refraction index of the first internal reflector 150 and the refraction index of the first color filter 130 is greater than 0.2.

The first unit 100 further includes a first lens 160 and a second lens 170. The first lens 160 is disposed on the first photodiode 110, and the second lens 170 is disposed on the second photodiode 120. The size of the second lens 170 is also greater than the size of the first lens 160.

Figure 3A:
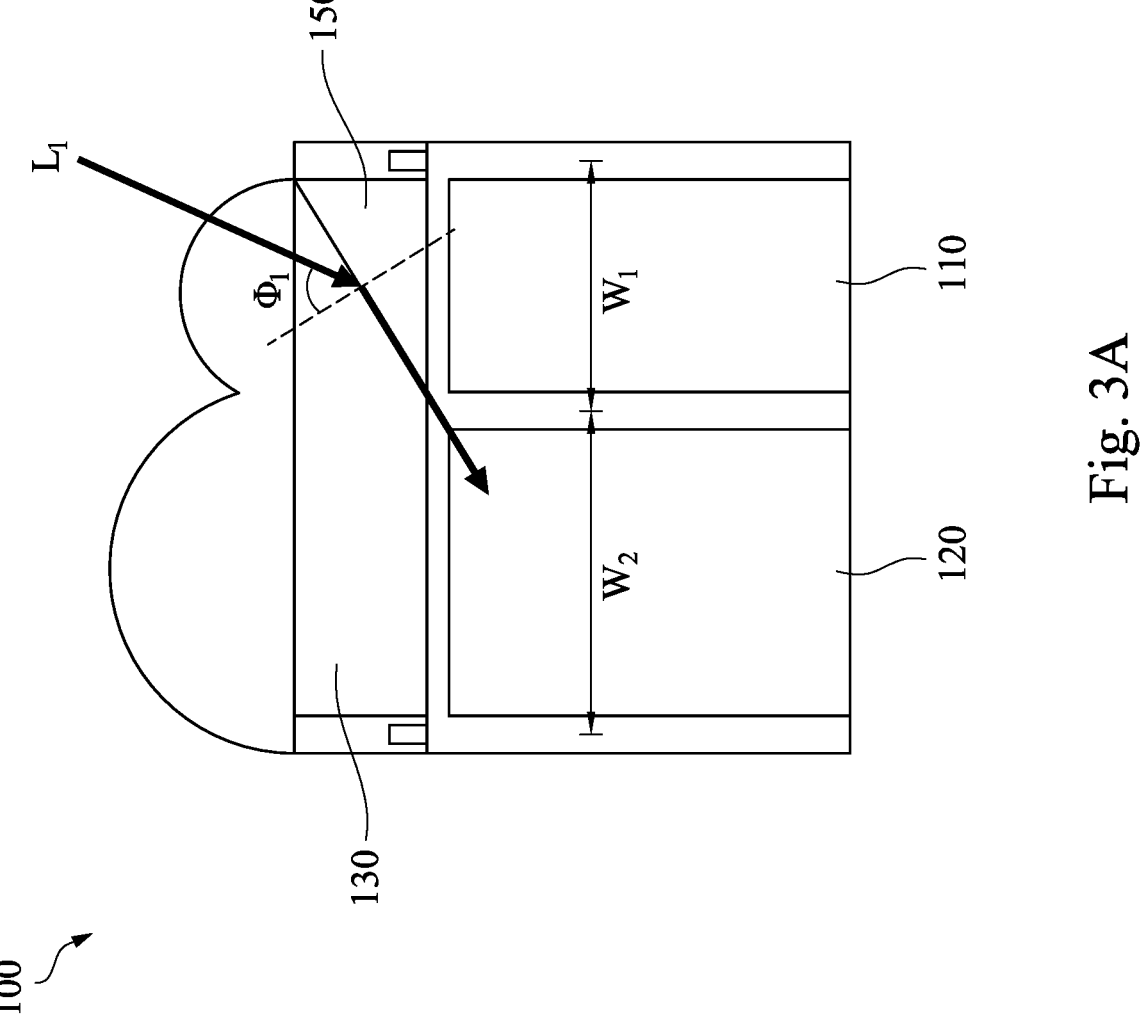
FIG. 3A to FIG. 3C are schematic views of different light paths of the first unit according to some embodiments of the disclosure.
Figure 3B:
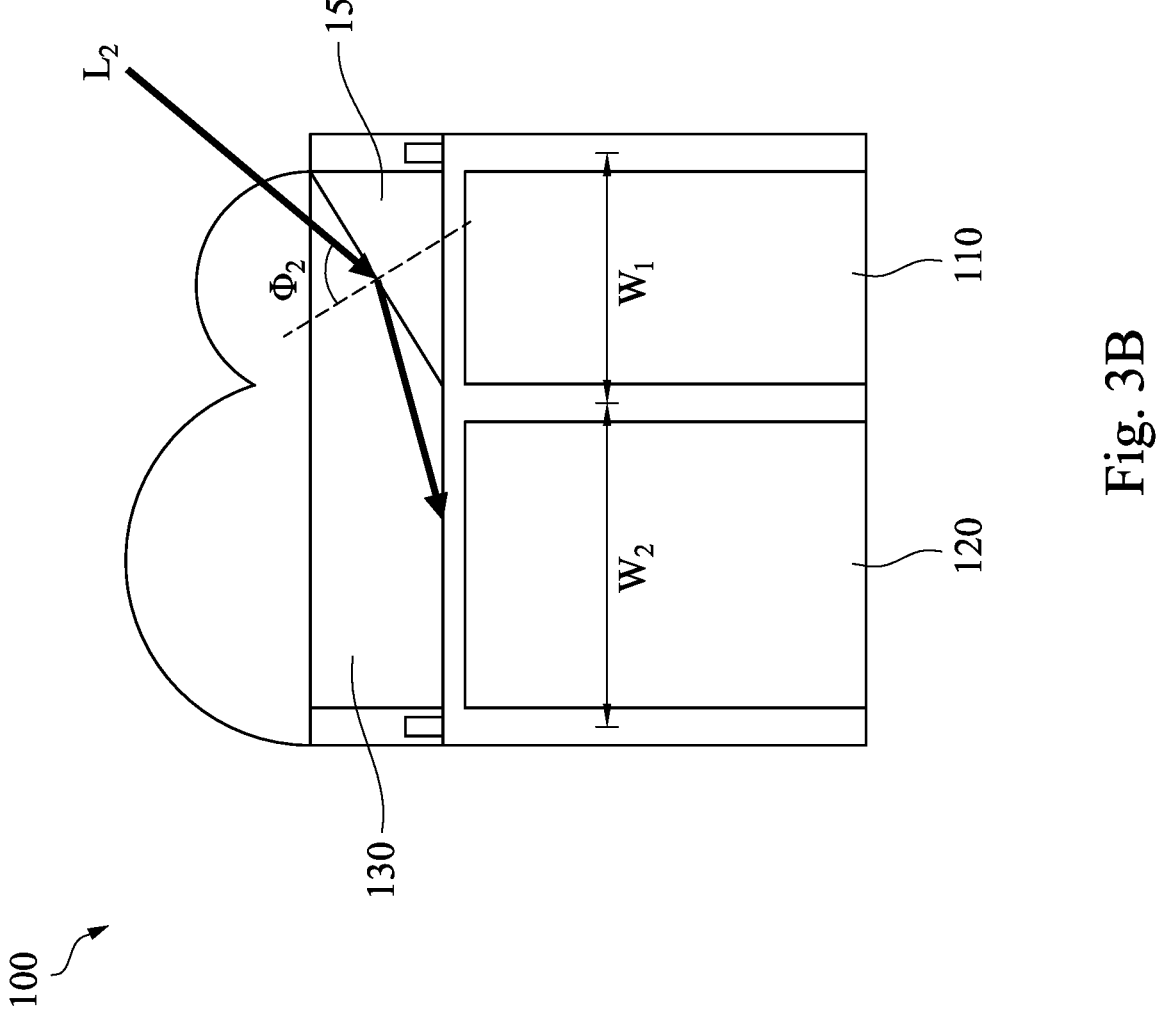
Figure 3C:
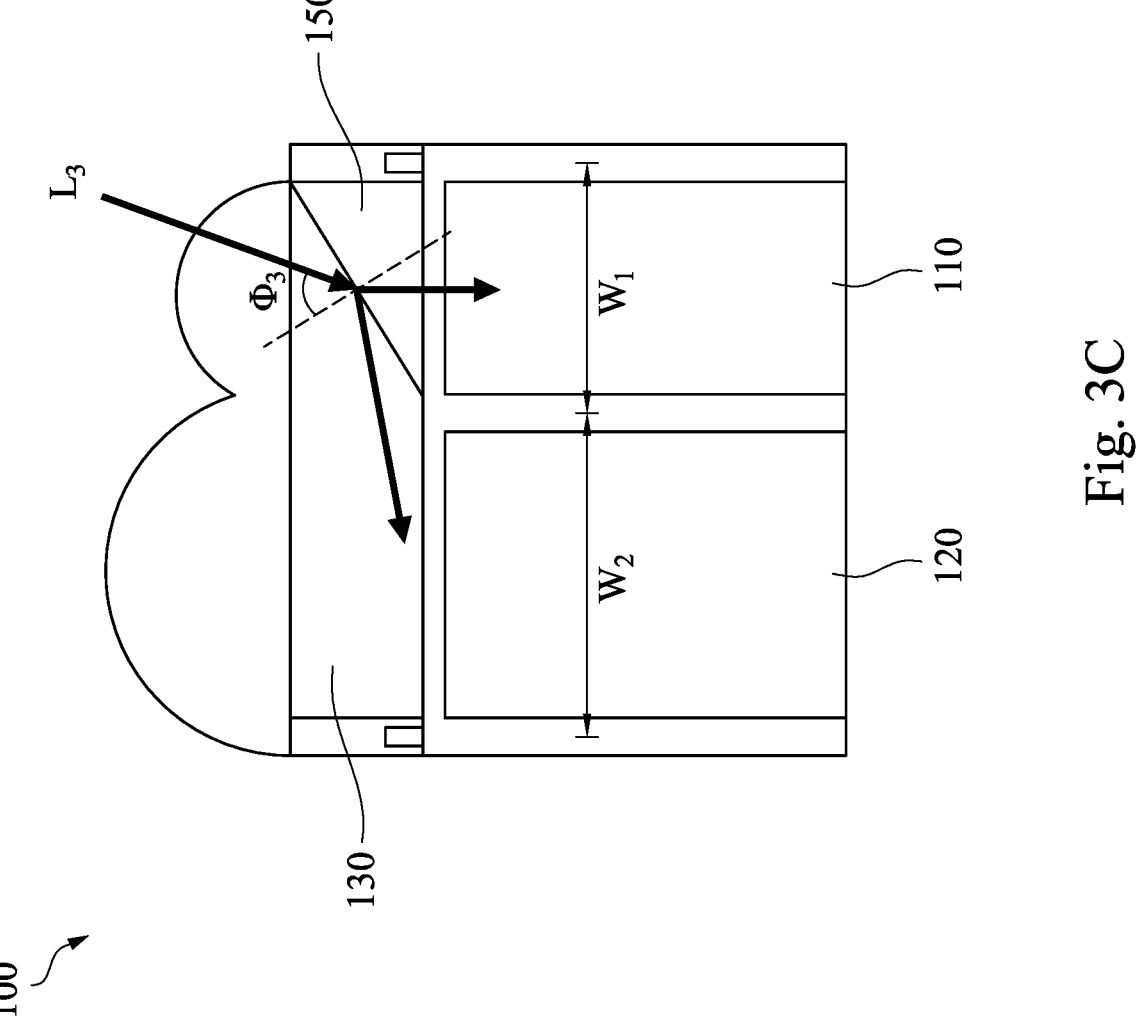

Reference is made to FIG. 3A to FIG. 3C. FIG. 3A to FIG. 3C are schematic views of different light paths of the first unit 100 according to some embodiments of the disclosure. The light paths of the first unit 100 are determined at least according to the refraction index difference between the first internal reflector 150 and the first color filter 130, the inclined angle of the first internal reflector 150, and the incident angle of the incident light.

In some situations, as shown in FIG. 3A, the incident angle $\phi_1$ of the incident light $L_1$ is substantially equal to the total internal reflection (TIR) angle of the interface between the first internal reflector 150 and the first color filter 130. When the incident light $L_1$ arrives at the interface from the first color filter 130 to the first internal reflector 150, the incident light $L_1$ is not refracted into the first internal reflector 150 and is not reflected back into the first color filter 130. The incident light $L_1$ is substantially transmitted along the interface between the first internal reflector 150 and the first color filter 130, and thus most amount of incident light $L_1$ goes to the second photodiode 120.

In some other situations, as shown in FIG. 3B, the incident angle $\phi_2$ of the incident light $L_2$ is greater than the TIR angle of the interface between the first internal reflector 150 and the first color filter 130. When the incident light $L_2$ arrives at the interface from the first color filter 130 to the first internal reflector 150, the incident light $L_2$ is not refracted into the first internal reflector 150 and is totally reflected back into the first color filter 130. The incident light $L_2$ is substantially transmitted in the first color filter 130, and thus most amount of incident light $L_2$ goes to the second photodiode 120.

In yet some other situations, as shown in FIG. 3C, the incident angle ¢3 of the incident light $L_3$ is less than the TIR angle of the interface between the first internal reflector 150 and the first color filter 130. When the incident light $L_3$ arrives at the interface from the first color filter 130 to the first internal reflector 150, a part of the incident light $L_3$ is refracted into the first internal reflector 150 then enters the first photodiode 110, and another part of incident light $L_3$ is reflected back into the first color filter 130 then enters the second photodiode 120. The light receiving amount of the second photodiode 120 includes the incident light directly enters the second photodiode 120 and the part of the incident light from the first photodiode 110.

As described in FIG. 3A to FIG. 3C, by adding the first internal reflector 150 in the first color filter 130, the light path of the incident light to the first unit 100 is rearranged, such that the sensitivity of the first photodiode 110 with the smaller dimension $W_1$ is reduced by the first internal reflector 150. Meanwhile, the sensitivity of the second photodiode 120 with the greater dimension $W_2$ may be increased by the first internal reflector 150.

Reference is made back to FIG. 2. The structure of the first internal reflector 150 is carefully designed to control the light path of the incident light. In some embodiments, a ratio of a height $H_2$ of the first internal reflector 150 to a height $H_1$ of the first grid 140 is from 0.3 to 1. If the first internal reflector 150 is too high or too short, the function of at least partially guiding the incident light to the second photodiode 120 would be failed. In some embodiments, the first internal reflector 150 has a fifth dimension $W_5$, and the fifth dimension $W_5$ is greater than the first dimension $W_1$ of the first photodiode 110 and is smaller than a sum of the first dimension $W_1$ of the first photodiode 110 and half of the second dimension $W_2$ of the second photodiode 120. That is, the first internal reflector 150 at least overlaps the first photodiode 110 and does not overlap more than half of the second photodiode 120. In some embodiments, the first internal reflector 150 overlaps the first photodiode 110 and a portion of the second photodiode 120.

In some embodiments, the first internal reflector 150 has an angle $\theta_1$ between the inclined light receiving surface 152 and the first photodiode 110 (e.g. the bottom surface 151 of the first internal reflector 150), and the angle $\theta_1$ satisfies:

$$\frac{0.3 * H_1}{0.5 * W_2 + W_1} \le \tan\theta_1 \le \frac{H_1}{W_1},$$

in which $H_1$ is a height of the first grid 140, $W_1$ is the first dimension of the first photodiode 110, and $W_2$ is the second dimension of the second photodiode 120. If the angle $\theta_1$ of the first internal reflector 150 does not satisfy above equation, the light path of the incident light would not be rearranged as desired.

Figure 4:
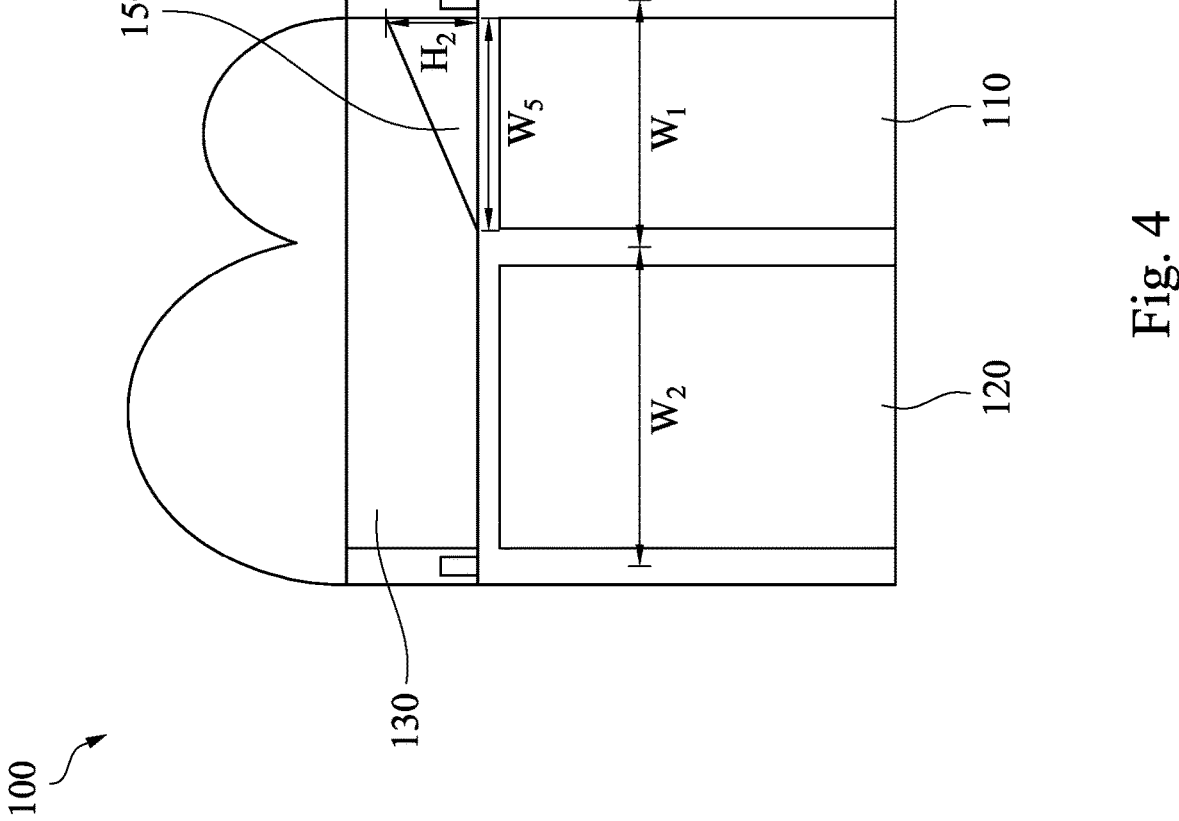
FIG. 4 and FIG. 5 are cross-sectional views of different embodiments of the first unit of the disclosure.
Figure 5:
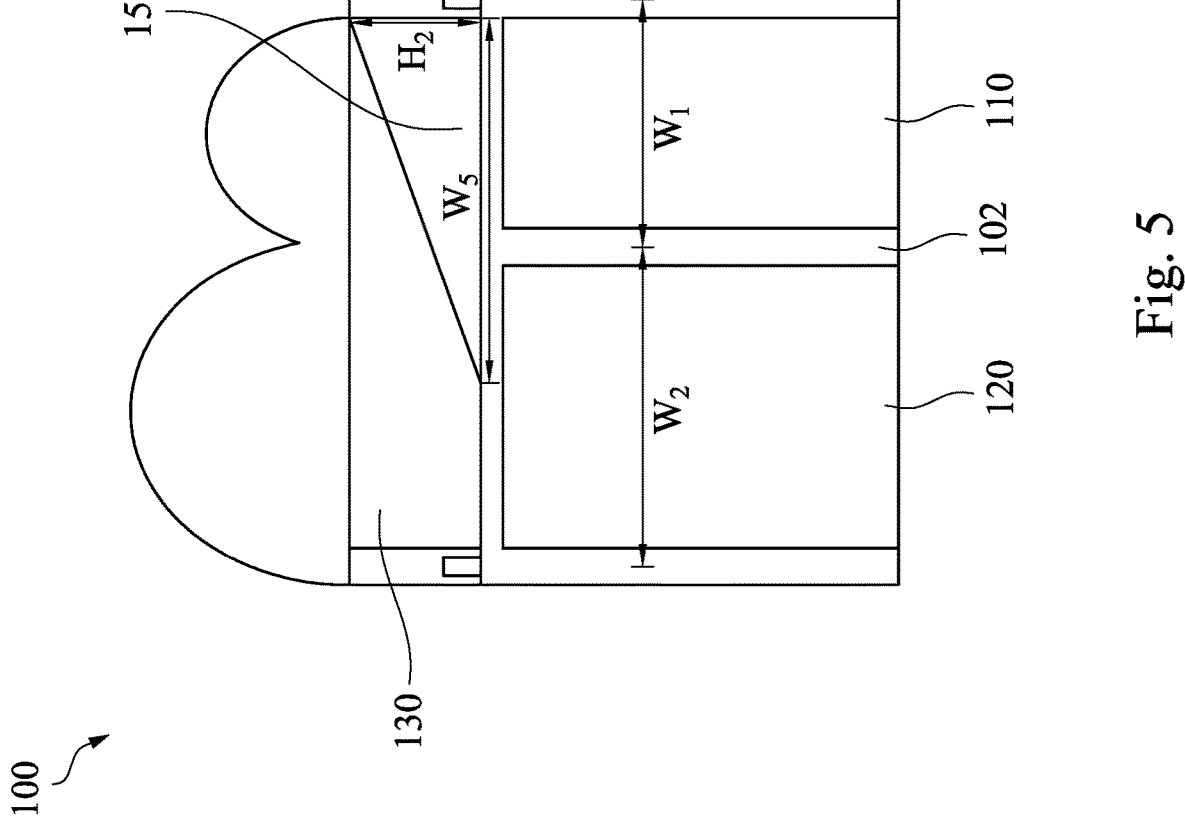

Therefore, as shown in FIG. 4 and FIG. 5, which are cross-sectional views of different embodiments of the first unit of the disclosure, with the increasing of the height $H_2$ of the first internal reflector 150, the fifth dimension $W_5$ of the first internal reflector 150 is increased accordingly. Meanwhile, with the decreasing of the height $H_2$ of the first internal reflector 150, the fifth dimension $W_5$ of the first internal reflector 150 is decreased accordingly. In some embodiments, as shown in FIG. 4, the first internal reflector 150 is shorter than the first color filter 130, and the first internal reflector 150 is on the first photodiode 110 and is not on the second photodiode 120. In some embodiments, as shown in FIG. 5, the first internal reflector 150 is on the first photodiode 110, on the portion of the deep trench isolation structure 102 between the first photodiode 110 and the second photodiode 120, and partially on the second photodiode 120.

Figure 6:
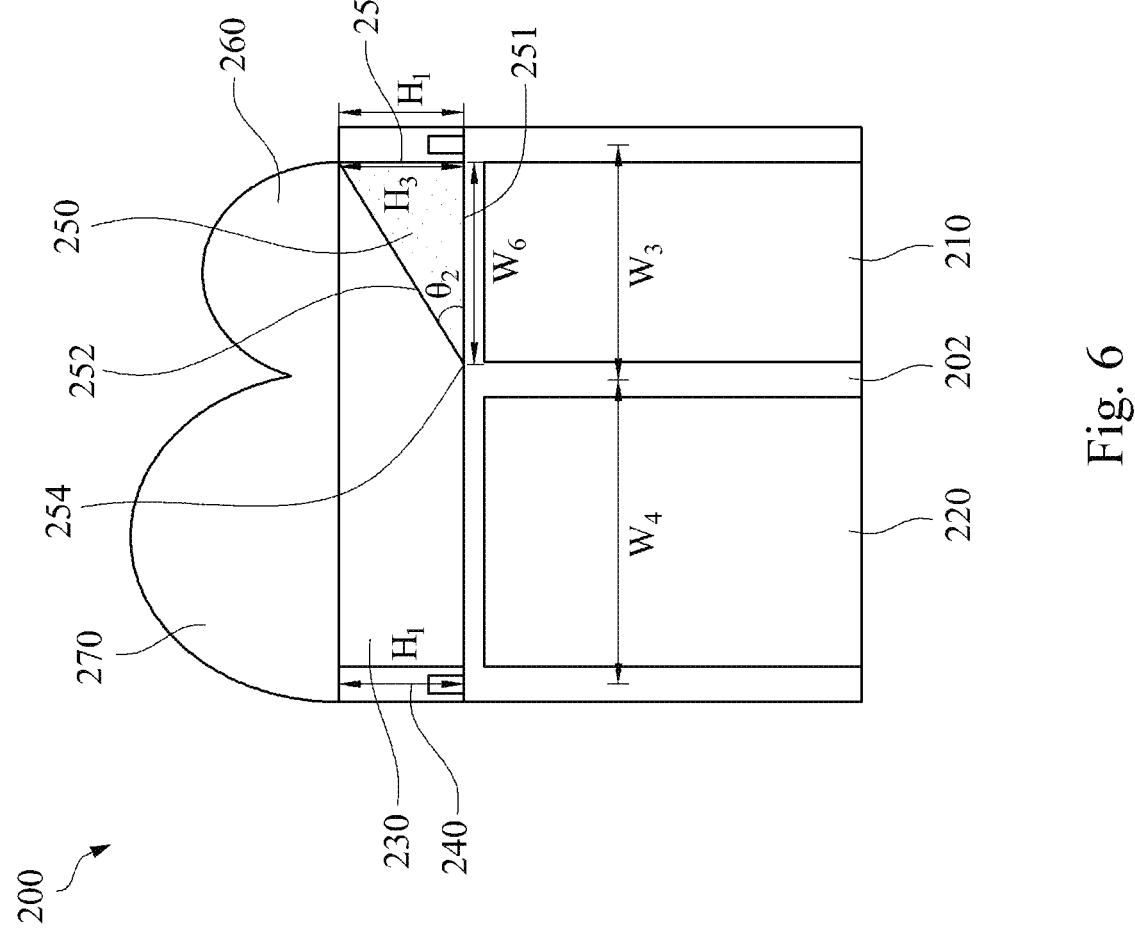
FIG. 6 is a cross-sectional view taken along line B-B of FIG. 1, illustrating the cross-section of the second unit according to some embodiments of the disclosure.

Reference is made to FIG. 6, which is a cross-sectional view taken along line B-B of FIG. 1, illustrating the cross-section of the second unit according to some embodiments of the disclosure. The second unit 200 includes a third photodiode 210 having a third dimension $W_3$ and a fourth photodiode 220 having a fourth dimension $W_4$. The fourth photodiode 220 is disposed adjacent the third photodiode 210, and the fourth dimension $W_4$ of the fourth photodiode 220 is greater than the third dimension $W_3$ of the third photodiode 210. In some embodiments, the third photodiode 210 and the fourth photodiode 220 share a symmetric axis $L'$.

More particularly, the second unit 200 includes a deep trench isolation structure 202 configured to separate the third photodiode 210 from the fourth photodiode 220. The third dimension $W_3$ of the third photodiode 210 is measured between the distance between centers of the pair of deep trench isolation structure 202 at opposite sides of the third photodiode 210 in the direction of the symmetric axis L', and the fourth dimension $W_4$ of the fourth photodiode 220 is measured between the distance between centers of the pair of deep trench isolation structure 202 at opposite sides of the fourth photodiode 220 in the direction of the symmetric axis L'.

The second unit 200 further includes a second color filter 230 overlapping the third photodiode 210 and the fourth photodiode 220. The second color filter 230 can be a R/G/B color filter or a C/Y/M color filter. The second color filter 230 extends continuously from the third photodiode 210 to the fourth photodiode 220. In some embodiments, the color of the second color filter 230 can be the same as or different from the color of the first color filter 130.

The second unit 200 further includes a second grid 240 surrounding the second color filter 230. Because the second color filter 230 overlaps the third photodiode 210 and the fourth photodiode 220, and the fourth dimension $W_4$ of the fourth photodiode 220 is greater than the third dimension $W_3$ of the third photodiode 210, the second grid 240 is not in a shape of rectangular and does not has a portion between the third photodiode 210 and the fourth photodiode 220.

More particularly, the second color filter 230 has a first portion 232 directly over the third photodiode 210 and a second portion 234 directly over the fourth photodiode 220, in which the first portion 232 and the second portion 234 allow the same wavelength band passing through. The first portion 232 of the second color filter 230 is directly connected to the second portion 234 of the second color filter 230, without any portion of the second grid 240 interposing therebetween.

The second unit 200 further includes a second internal reflector 250 disposed in the second color filter 230 and overlapping the third photodiode 210. A refraction index of the second internal reflector 250 is smaller than a refraction index of the second color filter 230, and a transparency of the second internal reflector 250 is different from a transparency of the first internal reflector 150. For example, the first internal reflector 150 is made of a transparent material, and the transparency of the second internal reflector 250 is less than the transparency of the first internal reflector 150. Namely, the second internal reflector 250 has an extinction coefficient greater than zero. In some embodiments, the extinction coefficient of the second internal reflector 250 is from 0.1 to 0.3.

In some embodiments, the second internal reflector 250 is a triangle prism having an extinction coefficient greater than zero. The second internal reflector 250 has an inclined light receiving surface 252 and a vertex 254 pointing to the fourth photodiode 220. More particularly, the second internal reflector 250 has a triangle cross-section, and the bottom surface 251 of the second internal reflector 250 is parallel and adjacent to the light receiving plane of the third photodiode 210, the side surface 253 of the second internal reflector 250 is perpendicular to the light receiving plane of the third photodiode 210, and inclined light receiving surface 252 interconnects the bottom surface 251 and the side surface 253 of the second internal reflector 250 and is inclined from a top surface of the second color filter 230 toward the fourth photodiode 220. In some embodiments, the second internal reflector 250 is completely embedded in the second color filter 230. The second unit 200 further includes a third lens 260 on the third photodiode 210 and a fourth lens 270 on the fourth photodiode 220.

Similar to the first unit 100, a refraction index of the second internal reflector 250 is smaller than a refraction index of the second color filter 230 such that the light path of the indicating light is modified by the interface between the second internal reflector 250 and the second color filter 230, to allow more light amount into the fourth photodiode 220 having the larger dimension $W_4$, as discussed in FIG. 3A to FIG. 3C. In some embodiments, the refraction index of the second internal reflector 250 is greater than 1. In some embodiments, a difference between the refraction index of the second internal reflector 250 and the refraction index of the second color filter 230 is greater than 0.2.

In some embodiments, a ratio of a height $H_3$ of the second internal reflector 250 to a height $H_1$ of the second grid 240 is from 0.3 to 1. If the second internal reflector 250 is too high or too short, the function of at least partially guiding the incident light to the fourth photodiode 220 would be failed. In some embodiments, the second internal reflector 250 has a sixth dimension $W_6$, and the sixth dimension $W_6$ is greater than the third dimension $W_3$ of the third photodiode 210 and is smaller than a sum of the third dimension $W_3$ of the third photodiode 210 and half of the fourth dimension $W_4$ of the fourth photodiode 220. That is, the second internal reflector 250 at least overlaps the third photodiode 210 and does not overlap more than half of the fourth photodiode 220. In some embodiments, the second internal reflector 250 overlaps the third photodiode 210 and a portion of the fourth photodiode 220.

In some embodiments, the second internal reflector 250 has an angle $\theta_2$ between the inclined light receiving surface 252 and the third photodiode 210 (e.g. the bottom surface 251 of the second internal reflector 250), and the angle $\theta_2$ satisfies:

$$\frac{0.3 * H_1}{0.5 * W_4 + W_3} \leq \tan\theta_2 \leq \frac{H_1}{W_3},$$

in which $H_1$ is a height of the second grid 240, $W_3$ is the third dimension of the third photodiode 210, and $W_4$ is the fourth dimension of the fourth photodiode 220. If the angle $\theta_2$ of the second internal reflector 250 does not satisfy above equation, the light path of the incident light would not be rearranged as desired. It is noted that the first grid 140 and the second grid 240 are formed by substantially the same processes, thus the heights of the first grid 140 and the second grid 240 are substantially the same.

Figure 7:
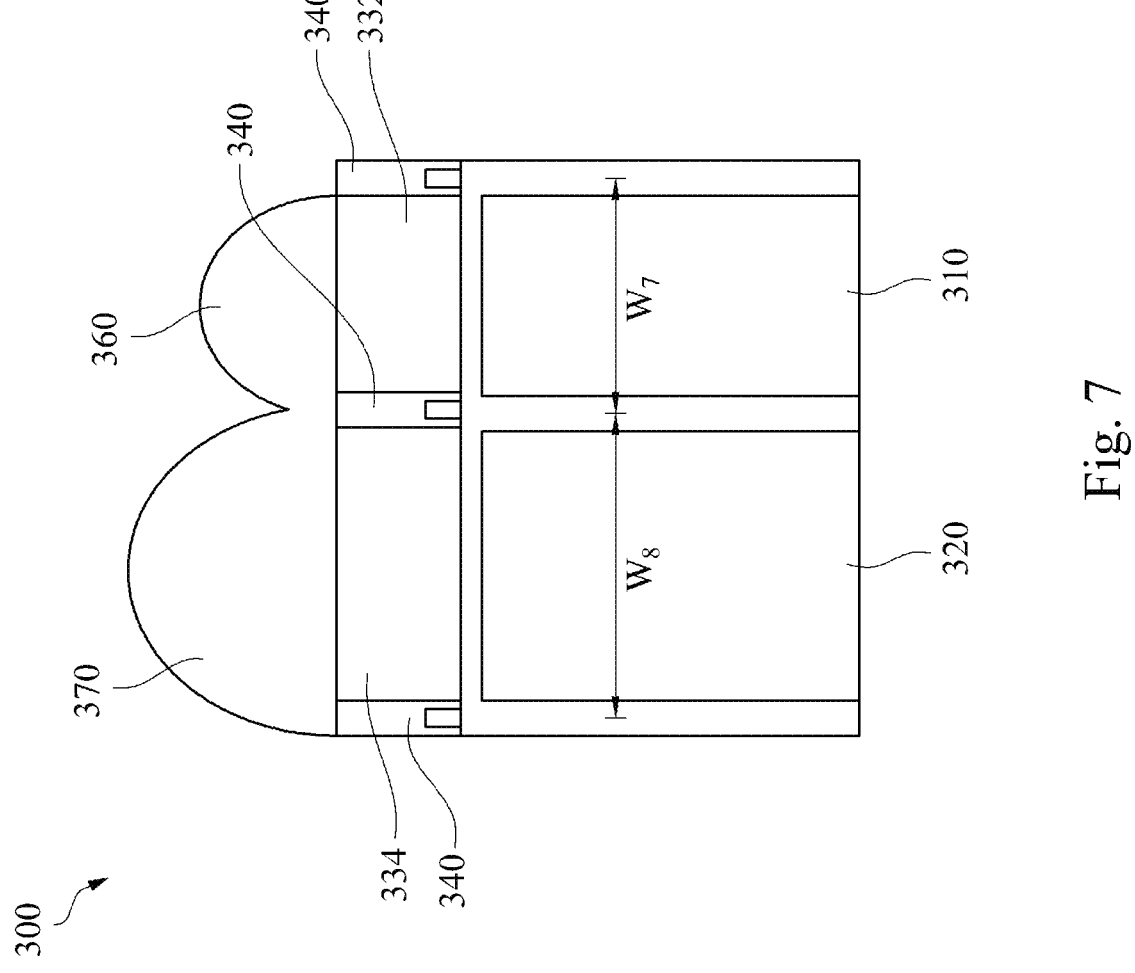
FIG. 7 is a cross-sectional view taken along line C-C of FIG. 1, illustrating the cross-section of the third unit according to some embodiments of the disclosure.

Reference is made to FIG. 7, which is a cross-sectional view taken along line C-C of FIG. 1, illustrating the cross-section of the third unit according to some embodiments of the disclosure. The third unit 300 includes a fifth photodiode 310 having a seventh dimension $W_7$ and a sixth photodiode 320 having an eighth dimension $W_8$. The fifth photodiode 310 is disposed adjacent the sixth photodiode 320, and the eighth dimension $W_8$ of the sixth photodiode 320 is greater than the seventh dimension $W_7$ of the fifth photodiode 310. The third unit 300 further includes a third color filter 330 overlapping the fifth photodiode 310 and the sixth photodiode 320. The third color filter 330 can be a R/G/B color filter or a C/Y/M color filter. In some embodiments, the color of the third color filter 330 can be the same as or different from the color of the first color filter 130 and/or the second color filter 230. There is no internal reflector in the third color filter 330.

The third unit 300 further includes a third grid 340 surrounding the third color filter 330. More particularly, the third color filter 330 has a first portion 332 directly over the fifth photodiode 310 and a second portion 334 directly over the sixth photodiode 320, in which the first portion 332 and the second portion 334 allow the same wavelength band passing through. The first portion 332 of the third color filter 330 is spaced apart from the second portion 334 of the third color filter 330 by a portion of the third grid 340. Namely, third grid 340 surrounds the first portion 332 and the second portion 334 of the third color filter 330 and has a portion that interposes therebetween. The third unit 300 further includes a fifth lens 360 on the fifth photodiode 310 and a sixth lens 370 on the sixth photodiode 320.

Figure 8:
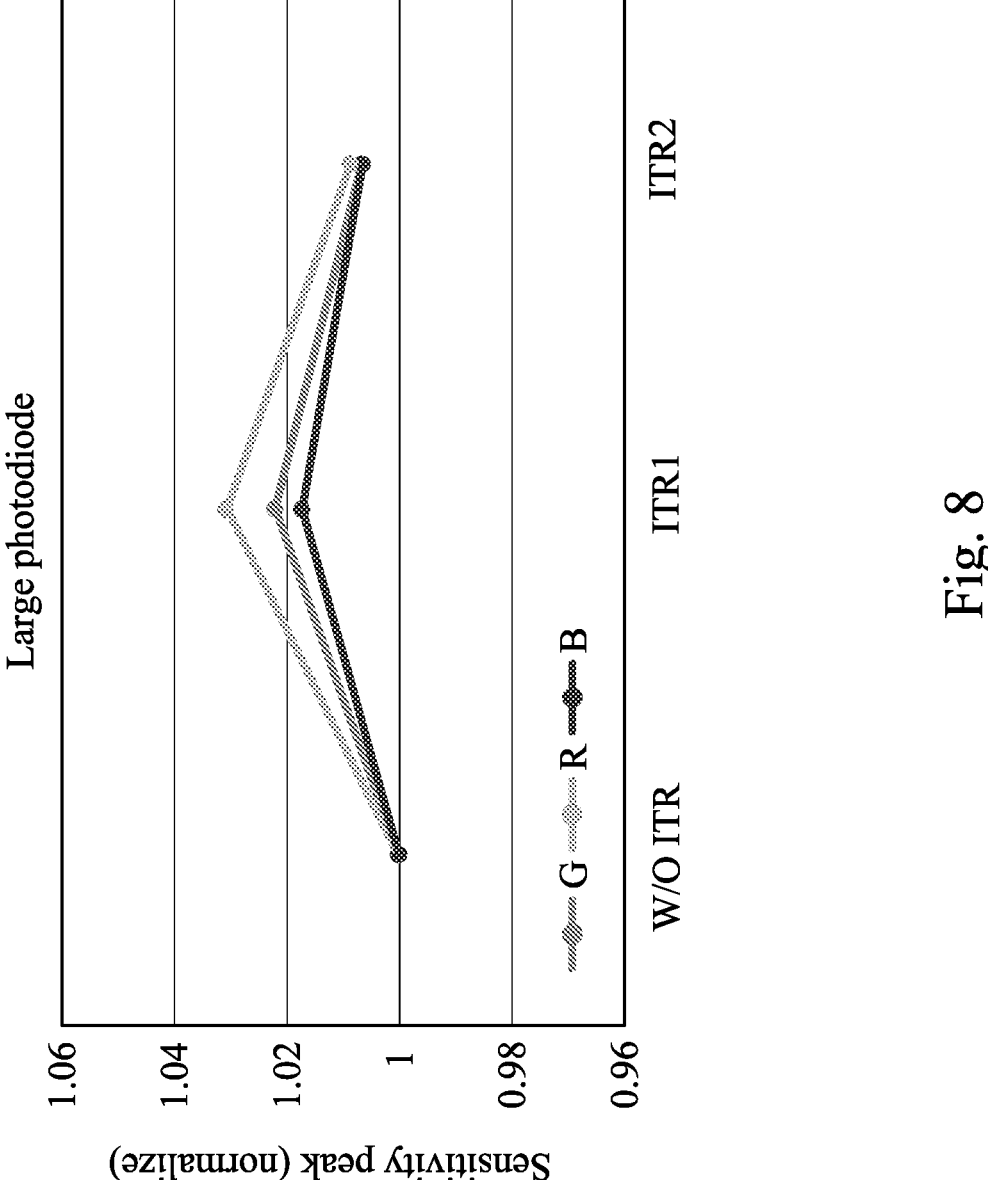
FIG. 8 and FIG. 9 are normalized sensitive peaks of large photodiodes and small photodiodes of the units of the image sensor, according to some embodiments of the disclosure.
Figure 9:
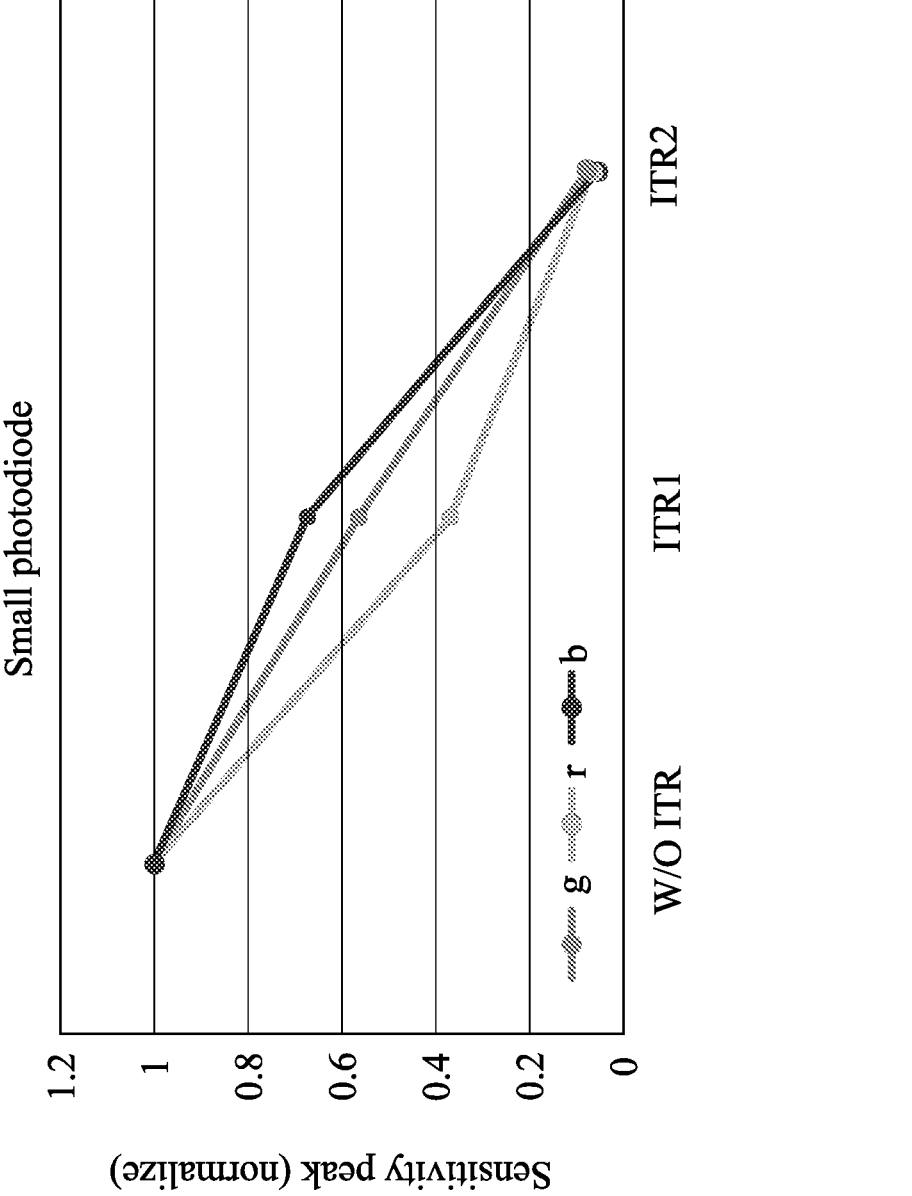

Reference is made to FIG. 8 and FIG. 9, which are normalized sensitive peaks of large photodiodes and small photodiodes of the units of the image sensor, according to some embodiments of the disclosure. The sensitive peak of the large photodiode of the unit without internal reflector (w/o ITR), such as the sixth photodiode of the third unit, is decided as 1. The sensitive peak of the large photodiode of the unit with a transparent internal reflector (ITR 1), such as the second photodiode of the first unit, is greater than 1. The sensitive peak of the large photodiode of the unit with an internal reflector having an extinction coefficient (ITR 2), such as the fourth photodiode of the second unit, is also greater than 1.

The sensitive peak of the small photodiode of the unit without internal reflector (w/o ITR), such as the fifth photodiode of the third unit, is decided as 1. The sensitive peak of the small photodiode of the unit with a transparent internal reflector (ITR 1), such as the first photodiode of the first unit, is less than 1. The sensitive peak of the small photodiode of the unit with an internal reflector having an extinction coefficient (ITR 2), such as the third photodiode of the second unit, is also less than 1.

According to the result of the FIG. 8 and FIG. 9, the incident light to the large photodiodes is increased by adding an internal reflector in the unit, and the incident light to the small photodiodes is decreased. The utilization of mixing the first, second, and third units can generate more sensitivity combinations of the image sensor, thus the purpose of multi-sensitivity ratios for high dynamic range (HDR) can be achieved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An image sensor comprising:

a first unit comprising:

a first photodiode having a first dimension;

a second photodiode disposed adjacent the first photodiode and having a second dimension that is greater than the first dimension;

a first color filter overlapping the first photodiode and the second photodiode, wherein the first color filter continuously covers an entire top surface of the first photodiode and an entire top surface of the second photodiode, without an inner grid in the first color filter, wherein the first unit comprises a first grid surrounding the first color filter; and a first internal reflector disposed in the first color filter and overlapping the first photodiode, wherein the first internal reflector has an inclined light receiving surface inclined from a top surface of the first color filter toward the second photodiode, and a refraction index of the first internal reflector is smaller than a refraction index of the first color filter, wherein the first internal reflector has an angle $\theta_1$ between the inclined light receiving surface and the first photodiode, and wherein the angle $\theta_1$ satisfies:

$$\frac{0.3 * H_1}{0.5 * W_2 + W_1} \le \tan\theta_1 \le \frac{H_1}{W_1},$$

in which $H_1$ is a height of the first grid, $W_1$ is the first dimension of the first photodiode, and $W_2$ is the second dimension of the second photodiode.

2. The image sensor of claim 1, wherein a difference between the refraction index of the first internal reflector and the refraction index of the first color filter is greater than 0.2.

3. The image sensor of claim 1, wherein a ratio of a height of the first internal reflector to a height of the first grid is from 0.3 to 1.

4. The image sensor of claim 1, wherein the first internal reflector has a fifth dimension, and the fifth dimension is greater than the first dimension of the first photodiode and is smaller than a sum of the first dimension of the first photodiode and half of the second dimension of the second photodiode.

5. The image sensor of claim 1, wherein the first internal reflector overlaps a portion of the second photodiode.

6. The image sensor of claim 1, wherein the first internal reflector comprises a transparent organic material.

7. The image sensor of claim 1, wherein the first internal reflector is a triangle prism, and a dimension of the first internal reflector is greater than a dimension of the first photodiode and is smaller than a sum of the dimension of the first photodiode and half of a dimension of the second photodiode.

8. The image sensor of claim 1, further comprising a second unit, the second unit comprising:

a third photodiode having a third dimension;

a fourth photodiode disposed adjacent the third photodiode and having a fourth dimension that is greater than the third dimension;

a second color filter overlapping the third photodiode and the fourth photodiode; and a second internal reflector disposed in the second color filter and overlapping the third photodiode, wherein the second internal reflector has an inclined light receiving surface inclined from a top surface of the second color filter toward the fourth photodiode, a refraction index of the second internal reflector is smaller than a refraction index of the second color filter, and a transparency of the second internal reflector is different from a transparency of the first internal reflector.

9. The image sensor of claim 8, wherein a difference between the refraction index of the second internal reflector and the refraction index of the second color filter is greater than 0.2.

10. The image sensor of claim 8, wherein the second unit comprises a second grid surrounding the second color filter, wherein a ratio of a height of the second internal reflector to a height of the second grid is from 0.3 to 1.

11. The image sensor of claim 8, wherein the second internal reflector has a sixth dimension, and the sixth dimension is greater than the third dimension of the third photodiode and is smaller than a sum of the third dimension of the third photodiode and half of the fourth dimension of the fourth photodiode.

12. The image sensor of claim 8, wherein the second unit comprises a second grid surrounding the second color filter, wherein the second internal reflector has an angle $\theta_2$ between the inclined light receiving surface and the third photodiode.

13. The image sensor of claim 12, wherein the angle $\theta_2$ satisfies:

$$\frac{0.3 * H_1}{0.5 * W_4 + W_3} \le \tan\theta_2 \le \frac{H_1}{W_3},$$

in which $H_1$ is a height of the second grid, $W_3$ is the third dimension of the third photodiode, and $W_4$ is the fourth dimension of the fourth photodiode.

14. The image sensor of claim 8, wherein the second color filter extends continuously from the third photodiode to the fourth photodiode.

15. The image sensor of claim 8, wherein an extinction coefficient of the second internal reflector is from 0.1 to 0.3.

16. The image sensor of claim 8, wherein the second internal reflector is a triangle prism.

17. The image sensor of claim 8, wherein the second internal reflector overlaps a portion of the fourth photodiode.

18. An image sensor comprising:
a first unit comprising:
   a first photodiode having a first dimension;
   a second photodiode disposed adjacent the first photodiode and having a second dimension that is greater than the first dimension;
   a first color filter overlapping the first photodiode and the second photodiode, wherein the first color filter continuously covers an entire top surface of the first photodiode and an entire top surface of the second photodiode, without an inner grid in the first color filter; and
   a first internal reflector disposed in the first color filter and overlapping the first photodiode, wherein the first internal reflector has an inclined light receiving surface inclined from a top surface of the first color filter toward the second photodiode, and a refraction index of the first internal reflector is smaller than a refraction index of the first color filter; and
a second unit, the second unit comprising:
   a third photodiode having a third dimension;
   a fourth photodiode disposed adjacent the third photodiode and having a fourth dimension that is greater than the third dimension;
   a second color filter overlapping the third photodiode and the fourth photodiode; and
   a second internal reflector disposed in the second color filter and overlapping the third photodiode, wherein the second internal reflector has an inclined light receiving surface inclined from a top surface of the second color filter toward the fourth photodiode, a refraction index of the second internal reflector is smaller than a refraction index of the second color filter, and a transparency of the second internal reflector is different from a transparency of the first internal reflector.

\* \* \* \* \*